(12) United States Patent
Sievert et al.

(10) Patent No.: US 10,013,008 B2
(45) Date of Patent: Jul. 3, 2018

(54) CURRENT DETECTION DEVICE AND METHOD FOR SENSING AN ELECTRICAL CURRENT

(71) Applicant: Robert Bosch GmbH, Stuttgart (DE)

(72) Inventors: Holger Sievert, Ludwigsburg (DE);
Stefan Butzmann, Schalksmühle (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/117,513

(22) PCT Filed: Dec. 19, 2014

(86) PCT No.: PCT/EP2014/078654
§ 371 (c)(1),
(2) Date: Aug. 9, 2016

(87) PCT Pub. No.: WO2015/120934
PCT Pub. Date: Aug. 20, 2015

(65) Prior Publication Data
US 2016/0349775 A1    Dec. 1, 2016

(30) Foreign Application Priority Data

Feb. 13, 2014 (DE) .......... 10 2014 202 610

(51) Int. Cl.
*G01R 1/20* (2006.01)
*G05F 1/573* (2006.01)
(Continued)

(52) U.S. Cl.
CPC .......... *G05F 1/573* (2013.01); *G01R 15/146* (2013.01); *G01R 19/0092* (2013.01)

(58) Field of Classification Search
CPC .... G01R 15/146; G01R 19/0092; G05F 1/573
(Continued)

(56) References Cited

U.S. PATENT DOCUMENTS 5,061,863 A * 10/1991 Mori ................. H01L 23/647
                                                    327/362
RE34,107 E * 10/1992 Wirth ................. H03K 17/0828
                                                    323/276
(Continued)

FOREIGN PATENT DOCUMENTS

CN         1671049        9/2005
CN       102217196       10/2011
(Continued)

OTHER PUBLICATIONS

Keysight, IGBT Sense Emitter Current Measurement Using the Keysight B1505A—Application Note. Keysight Technologies Copyright Aug. 2014.*
(Continued)

*Primary Examiner* — Patrick Assouad
*Assistant Examiner* — Sean Curtis
(74) *Attorney, Agent, or Firm* — Michael Best & Friedrich LLP

(57) ABSTRACT

The invention relates to the evaluation of a variable of an electric current in a power path by evaluating another electric current in a measuring path. To avoid excessively large electric currents in the measuring path, the current in said path is limited to a predetermined maximum limit value.

14 Claims, 2 Drawing Sheets

(51) Int. Cl.
*G01R 19/00* (2006.01)
*G01R 15/14* (2006.01)

(58) Field of Classification Search
USPC .......................................................... 324/126
See application file for complete search history.

(56) References Cited

U.S. PATENT DOCUMENTS

| | | | | |
|---|---|---|---|---|
| 5,200,878 | A * | 4/1993 | Sasagawa | H03K 17/0828 361/101 |
| 5,500,619 | A * | 3/1996 | Miyasaka | H03K 17/08128 327/427 |
| 5,710,508 | A * | 1/1998 | Watanabe | H03K 17/0828 323/284 |
| 5,877,617 | A * | 3/1999 | Ueda | G05F 3/247 323/315 |
| 6,054,890 | A * | 4/2000 | Giacomo | H03K 17/0828 327/375 |
| 6,097,582 | A * | 8/2000 | John | H03K 17/165 361/79 |
| 6,194,884 | B1 * | 2/2001 | Kesler | G05F 3/222 323/285 |
| 6,633,473 | B1 * | 10/2003 | Tomomatsu | H01L 29/7395 257/E29.198 |
| 6,867,986 | B2 * | 3/2005 | Amei | H02M 3/33507 363/131 |
| 7,083,391 | B2 * | 8/2006 | Sievert | B60T 8/4059 417/42 |
| 7,265,538 | B2 * | 9/2007 | Micke | G01P 3/44 318/400.13 |
| 8,680,897 | B2 * | 3/2014 | Itou | H03K 17/04126 327/109 |
| 8,749,222 | B2 * | 6/2014 | Williams | H01L 23/49575 324/76.11 |
| 8,879,226 | B2 * | 11/2014 | Esumi | H03K 17/0822 361/93.1 |
| 8,994,438 | B2 * | 3/2015 | Gediga | H03K 17/14 327/108 |
| 9,184,651 | B2 * | 11/2015 | Nguyen | H02M 1/08 |
| 9,664,713 | B2 * | 5/2017 | Sambucco | G01R 19/0092 |
| 9,722,581 | B2 * | 8/2017 | Zhao | H03K 3/012 |
| 2004/0155662 | A1 | 8/2004 | Graf et al. | |
| 2007/0171590 | A1 * | 7/2007 | Nagata | H02H 3/087 361/93.1 |
| 2007/0263334 | A1 * | 11/2007 | Nishida | H02H 3/087 361/103 |
| 2010/0289562 | A1 * | 11/2010 | Kohama | H03K 17/0828 327/541 |
| 2011/0221421 | A1 * | 9/2011 | Williams | G01R 19/0092 324/76.11 |
| 2011/0304941 | A1 * | 12/2011 | Tanimura | H02J 3/14 361/93.9 |
| 2012/0098517 | A1 * | 4/2012 | Esumi | H03K 17/0822 323/311 |
| 2012/0194226 | A1 * | 8/2012 | Itou | H03K 17/168 327/109 |
| 2013/0009655 | A1 * | 1/2013 | Marten | G01R 1/203 324/713 |
| 2014/0015005 | A1 * | 1/2014 | Ishii | F02P 11/00 257/139 |
| 2014/0015046 | A1 | 1/2014 | Thiele et al. | |
| 2014/0111171 | A1 * | 4/2014 | Kosugi | H02M 1/08 323/271 |
| 2014/0145779 | A1 * | 5/2014 | Gediga | H03K 17/0828 327/378 |
| 2014/0285178 | A1 * | 9/2014 | Williams | H01L 23/49575 324/76.11 |
| 2015/0222171 | A1 * | 8/2015 | Nguyen | H02M 1/08 323/282 |
| 2015/0365083 | A1 * | 12/2015 | Jaeger | H03K 17/687 327/109 |
| 2016/0124027 | A1 * | 5/2016 | Sambucco | G01R 19/0092 324/76.11 |
| 2016/0191021 | A1 * | 6/2016 | Zhao | H03K 17/127 327/109 |
| 2016/0349289 | A1 * | 12/2016 | Sievert | G01R 19/0092 |
| 2016/0349775 | A1 * | 12/2016 | Sievert | G01R 19/0092 |
| 2016/0356817 | A1 * | 12/2016 | Sievert | G01R 19/0092 |
| 2017/0010318 | A1 * | 1/2017 | Butzmann | H03K 17/18 |
| 2017/0040802 | A1 * | 2/2017 | Hopperdietzel | G01R 15/183 |

FOREIGN PATENT DOCUMENTS

| | | |
|---|---|---|
| CN | 102243262 | 11/2011 |
| DE | 4015625 | 11/1990 |
| EP | 0599605 | 6/1994 |
| EP | 0647026 | 4/1995 |
| JP | 05259853 A * | 10/1993 |
| JP | 10032476 A * | 2/1998 |

OTHER PUBLICATIONS

International Search Report for Application No. PCT/EP2014/078654 dated Apr. 9, 2015 (English Translation, 3 pages).

* cited by examiner

CURRENT DETECTION DEVICE AND METHOD FOR SENSING AN ELECTRICAL CURRENT

BACKGROUND OF THE INVENTION

The present invention relates to a current detection device and a method for sensing an electric current. The present invention particularly relates to a current detection device and a method for sensing an electric current in a measuring path, which conducts a current that corresponds to an electric current in a power path.

Although the present invention is described in connection with IGBTs, which have a sense connection, said present invention can furthermore be used for any other applications in which a current is to be evaluated in another current path which corresponds to the current in a power path.

The American patent publication U.S. Pat. No. 5,877,617 A discloses a circuit arrangement in which a load is supplied with current in a current path. The circuit arrangement furthermore comprises an additional transistor which provides a current that corresponds to this current for the load. The current that is provided via the additional transistor is used to monitor and evaluate the current flow for the load.

Bipolar transistors with an insulated gate (IGBT) are furthermore known, for example, for measuring and evaluating a current through a semiconductor switch. In the case of such bipolar transistors, a current is provided at an additional sense connection which is proportional to the main current through the semiconductor switch. The current from the sense connection is less than the main current in the emitter path of the IGBT by an approximately constant factor.

The circuit arrangement for evaluating the current in the sense path of such an IGBT has to be dimensioned for the maximum duty cycle of the IGBT and also for the maximally occurring currents. In this case, relatively large currents can even occur in the sense path, in particular in the event of a fault.

There is therefore the need for an improved evaluation circuit for a circuit arrangement in which a current evaluation takes place via a separate measuring path. There is particularly a need for a current evaluation circuit which is also not overloaded when larger currents occur in the measuring path.

SUMMARY OF THE INVENTION

According to one aspect, the present invention relates to a current detection device for sensing an electric current in a measuring path, which conducts an electric current that corresponds to an electric current in a power path, The current detection device comprises a current measuring device, which is disposed in the measuring path and is designed to provide an output signal which corresponds to an electric current that flows through said current measuring device, and a current limiting device which is designed to limit the electric current through the current measuring device to a predetermined maximum limit value.

According to a further aspect, the present invention relates to a method for sensing an electric current in a measuring path, which conducts an electric current that corresponds to an electric current in a power path, comprising the following steps: providing a current measuring device; sensing an electric current through the current measuring device provided; emitting an output signal at the current measuring device in accordance with the sensed electric current; and limiting the electric current through the current measuring device to a predetermined maximum limit value.

The concept underlying the present invention is that, when evaluating an electric current in a measuring path, the electric current to be evaluated is limited to a maximum electric current. If, on the other hand, the electric current in the measuring path does not reach this maximum limit value, the electric current in the measuring path is then not influenced. By limiting the electric current in the measuring path to a maximum limit value, the individual components for evaluating the electric current in this path can be set up to evaluate the electric current in this path with respect to this predetermined maximum limit value. Because a further increase in the electric current is not to be expected due to the limitation thereof, the individual components can therefore be dimensioned considerably smaller. This allows, on the one hand, for a more cost effective construction of the evaluation circuit for the electric current. In addition, such components also require a smaller construction size for a smaller maximum electric current; thus enabling the evaluation circuit to furthermore require only a small construction volume than would be the case for an evaluation circuit without the inventive limitation of the electric current to be evaluated. As a result of the limitation of the maximum electric current occurring in the measuring path, the maximum power loss associated therewith and thus the heat quantity to be dissipated can be reduced. The fact that the evaluation circuit is heated up to a lesser extent for the electric current to be monitored has not least a positive effect on the service life of the evaluation circuit.

The current measuring device of the current evaluation circuit according to the invention can in this case be an arbitrary device which is disposed between two connections and through which an electric current can flow. In so doing, the current measuring device provides an output signal, which is a function of the electric current which flows through the current measuring device. The output signal can, for example, be a voltage signal which corresponds to the electric current through the current measuring device. Such a voltage signal can, for example, be generated by means of a shunt resistor, through which electric current passes. Hence, a voltage signal can be easily generated which is proportional to the electric current through the shunt resistor. Further options for generating an output signal that is dependent on the electric current through the current measuring device are also likewise possible.

Precisely during a signal conversion of an electric current into an electric voltage by means of a resistor, a power loss also occurs at the electric resistor, which is dependent on the electric current through the resistor. When the electric current increases, the losses at the current measuring device thus increase accordingly. In order to prevent large losses, the electric current through the current measuring device is limited to a maximum limit value. By limiting the maximum current through the current measuring device, the losses and the thermal heating associated therewith are therefore also limited at the same time. Hence, the current evaluation circuit can be prevented from excessively heating up.

The output signal of the current measuring device can, for example, be used to determine the current through the current evaluation device. If it is determined by the output signal of the current evaluation circuit provided that the electric current through the current evaluation circuit exceeds a predetermined limit value, the current limiting device can then be actuated, which for its part limits the maximum current through the current evaluation device, in particular through the current measuring device. In this way, a simple limitation of the maximum current through the current measuring device can be achieved.

According to one embodiment of the invention, the current measuring device is designed to provide a voltage signal which is proportional to the electric current that flows through the current measuring device. By providing a voltage signal at the output of the current measuring devices, the variable of the electric current through the current measuring device can be particularly advantageously provided.

According to one embodiment of the invention, the current measuring device comprises an analog/digital converter. The analog/digital converter is designed to convert the output signal provided by the current measuring device into a digital signal. In a preferable manner, the analog/digital converter has a high impedance. In this way, the further processing of the value of the electric current through the current measuring device can take place digitally without the current evaluation circuit being electrically excessively loaded in the process.

According to one embodiment of the invention, the current limiting device comprises a reference voltage source. The reference voltage source is designed to provide a predetermined reference voltage. In addition, the current limiting device is designed to compare a voltage signal with the reference voltage provided by the reference voltage source. The current limiting device thereby adjusts the electric current through the current measuring device on the basis of this comparison. By providing a reference voltage source and the comparison of a voltage signal to the reference voltages, it can be very easily determined whether the electric current through the current measuring device has exceeded a limit value. This excessive electric current can accordingly be automatically limited on the basis of this comparison.

According to one embodiment of the invention, the current limiting device comprises a transistor with a control connection. The current limiting device is designed in this case to provide a control signal at the control connection of the transistor, said control signal being dependent on the comparison between the reference voltage provided and a voltage signal. In this way, the current through the current measuring device can be limited and an excessive electric current through the current measuring device is prevented.

The present invention further relates to a circuit arrangement for providing an electric current, comprising a current control device, which is designed to provide an electric current in a power path and to provide an electric measuring current (sense current) in a measuring path which corresponds to the electric current provided in the power path, and comprising a current detection device according to the invention.

In accordance with one device for carrying out the invention, the current carrying device comprises a bipolar transistor having an insulated gate (IGBT). The bipolar transistor having the insulated gate preferably has a measuring connection, which provides a measuring current that corresponds to the current at the power output.

According to one embodiment of the invention, the method for sensing an electric current further comprises the following steps: providing a predetermined reference voltage and comparing the reference voltage provided to a voltage value. The step for limiting the electric current adjusts the electric current as a function of the comparison of the reference voltage provided to the voltage value.

Further embodiments and advantages of the present invention ensue from the following description with reference to the attached drawings.

DETAILED DESCRIPTION

Figure 1:
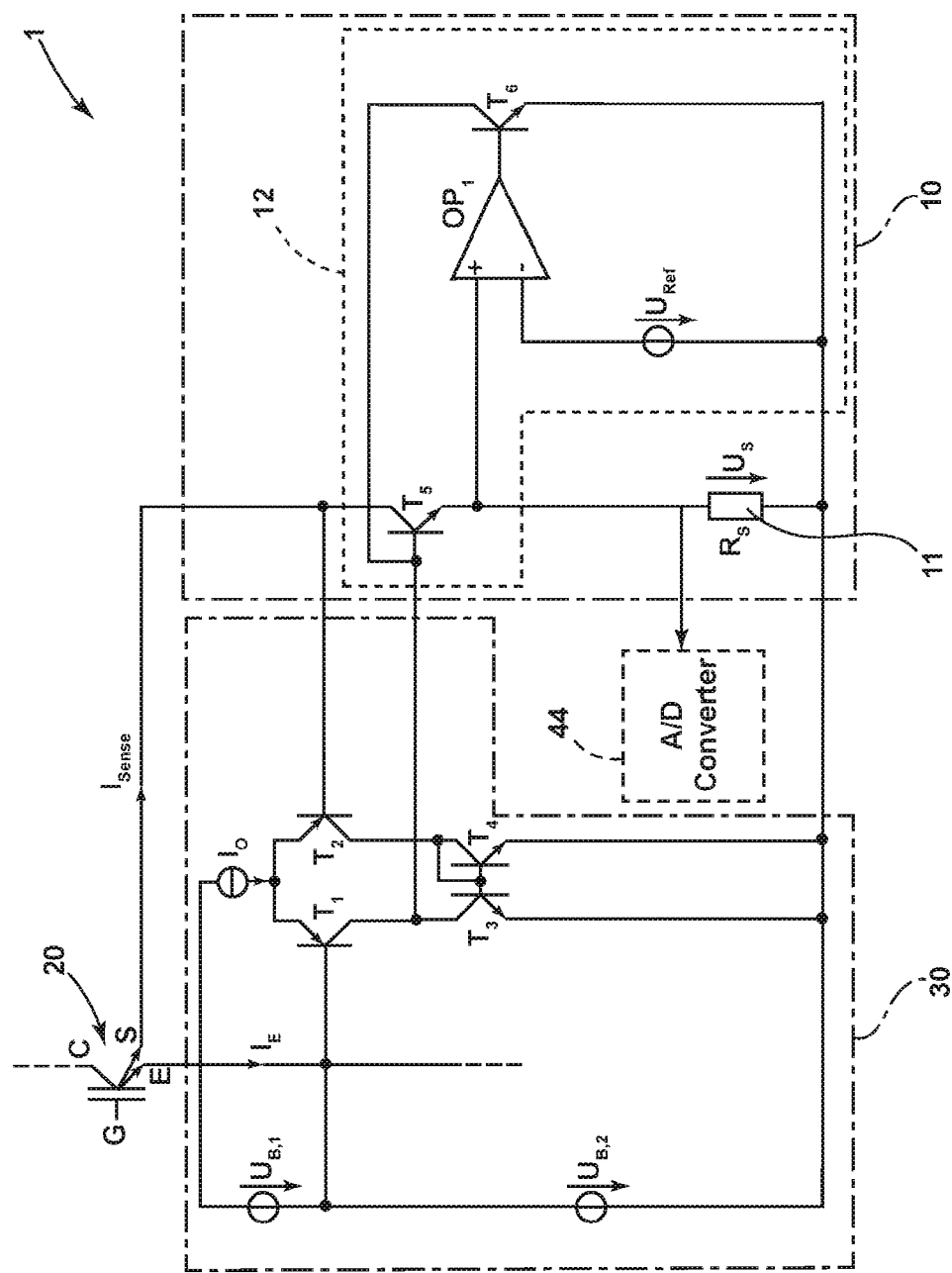
FIG. 1 shows a schematic depiction of an exemplary circuit for a circuit arrangement comprising a current detection device according to one exemplary embodiment.

FIG. 1 shows a schematic exemplary circuit of a circuit arrangement for controlling an electric current in a power path. The circuit arrangement 1 comprises a current control device 20. The current control device 20 can relate, for example, to a bipolar transistor having an insulated gate (IGBT). In so doing, the IGBT comprises an input connection C, an output connection E and a control connection G. By applying a control signal to the control connection G, the current between input connection C and output connection E can be controlled. In addition, the IGBT further comprises a sense connection S. A measuring current $I_{Sense}$ is provided by the IGBT at this sense connection S. This measuring current $I_{Sense}$ corresponds to the current $I_E$ in the power path of the depicted circuit arrangement. In the case of a known IGBT, an inference can be made about the electric current $I_E$ of the power path from the measuring current $I_{Sense}$ of the sense path. The measuring current $I_{Sense}$ is generally smaller than the current $I_E$, which is provided at the output E of the IGBT, by a known transmission factor. Because the relationship between electric current and drop in voltage is non-linear in the power or measuring path, the constant ratio between $I_E$ and $I_{Sense}$ only then applies if the voltage between the input connection C and the sense connection S is identical to the voltage between the input connection C and the output connection E. In order to set these identical voltage ratios, a compensation circuit 30 is connected to the sense connection S and to the output connection E, said compensation circuit setting identical voltage ratios at the sense connection S and the output connection E. In the exemplary embodiment depicted here, the compensation circuit comprises, for example, the two voltage sources $U_{B,1}$ and $U_{B,2}$ as well as the current source $I_0$. The compensation circuit further comprises the four transistors $T_1$, $T_2$, $T_3$ and $T_4$. The transistor $T_5$ is actuated by means of this circuit arrangement.

The circuit arrangement further comprises a current evaluation circuit 10, by means of which the measuring current $I_{Sense}$ is sensed by the current control device 20 and can be converted into an evaluation signal that is suitable for further processing. For this purpose, the measuring current $I_{Sense}$ flows across the transistor $T_5$ and the current measuring device 11. The current measuring device can, for example, be implemented by means of a shunt resistor $R_S$ as depicted here. As a result, a voltage signal $U_S$ proportional to the measuring current $I_{Sense}$ drops across the shunt resistor $R_S$. If the measuring current $I_{Sense}$ increases, the voltage signal $U_S$ thus also increases.

In the process, the transistor $T_5$ is initially actuated by the compensation circuit in such a way that the same potential appears at the measuring connection S of the IGBT as at the power connection E of the IGBT. The result then is that a constant transmission ratio arises between the current $I_E$ in the power path of the circuit arrangement 1 and the current $I_{Sense}$ in the measuring path and thus an inference can reliably be made about the current in the power path $I_E$ from the measuring current $I_{Sense}$.

When the current $I_E$ increases in the power path of the circuit arrangement 1, the measuring current $I_E$ therefore also increases initially in the measuring path of the circuit arrangement 1. In order, however, not to allow the current $I_{Sense}$ in the measuring path to arbitrarily increase, the current $I_{Sense}$ in the measuring path is limited to a predetermined limit value. To this end, the current $I_{Sense}$ can be limited in the measuring path by actuating the transistor $T_5$. The actuating signal for the control connection of the transistor $T_5$ for limiting the measuring current $I_{Sense}$ can be generated, for example, by a suitable circuit which evaluates the output signal of the current measuring device 11, for example by means of the drop in voltage $U_S$ across the shunt resistor $R_S$. The drop in voltage $U_S$ can, for example, be compared to a voltage of a reference voltage source $U_{Ref}$. For this purpose, the voltage signal of the reference voltage source $U_{Ref}$ and the drop in voltage $U_S$ across the shunt resistor $R_S$ can, for example, be supplied to an operational amplifier OP. The operational amplifier OP compares the two voltage signals and emits a control signal in accordance with this comparison. This control signal can, if applicable, be supplied to the control connection of the transistor $T_5$ after suitable amplification by the transistor $T_6$. To this end, the output of the operational amplifier OP can be connected to the control connection of the transistor $T_6$. Further alternative options for limiting the measuring current $I_{Sense}$ are, of course, also possible.

The output signal of the current measuring device 11, for example the drop in voltage $U_S$ across the shunt resistor, can, for the purpose of further processing, be converted into a digital signal by an analog/digital (A/D) converter 44. In so doing, this preferably relates to an analog/digital converter 44 having a high impedance, so that the output signal of the current measuring device 11 is not or not significantly influenced by the corresponding converter. In this way, a digital further processing of the output signal of the current detection device 10 is also possible.

Figure 2:
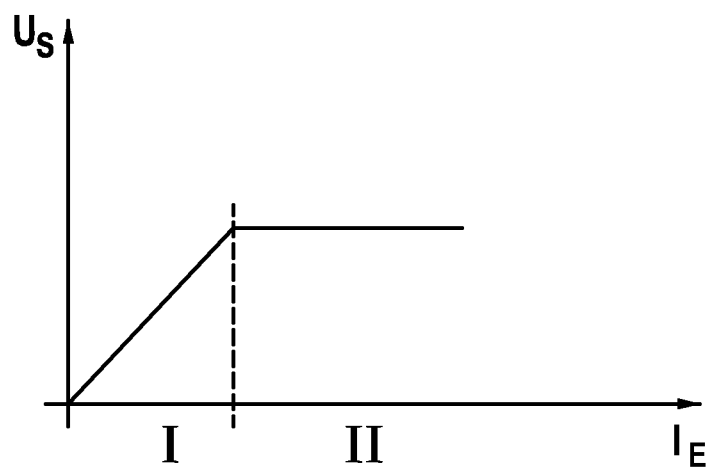
FIG. 2 shows a schematic depiction of a current/voltage characteristic diagram as said diagram underlies a current detection device according to one exemplary embodiment.

FIG. 2 shows a schematic depiction of a voltage/current characteristic diagram as said diagram underlies an embodiment of the present invention. In a first section I, the current detection device 10 according to the invention initially generates an output signal $U_S$ which corresponds to the current $I_E$ in the power path. As depicted here, a linear relationship preferably prevails in this case between output voltage $U_S$ and current in the power path $I_E$. If the current $I_E$ in the power path exceeds a predetermined threshold value, the corresponding current $I_{Sense}$ in the measuring path would thereupon likewise further increase. This further increase in section II can, however, be limited by the inventive limitation of the current $I_{Sense}$ in the measuring path to a maximum predetermined limit value; thus enabling the output voltage $U_s$, which corresponds to the current $I_{Sense}$ in the measuring path, to be limited to a predetermined maximum value.

Figure 3:
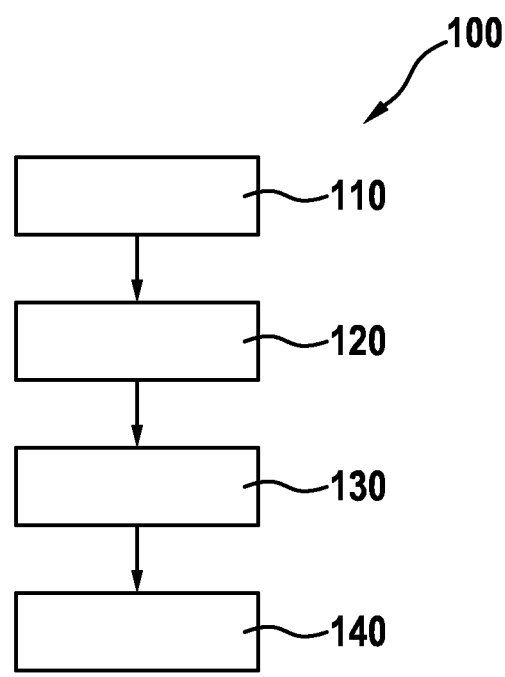
FIG. 3 shows a schematic depiction of a flow diagram for a method as said method underlies a further exemplary embodiment.

FIG. 3 shows a schematic depiction of a flow diagram as said diagram underlies a method 100 for sensing an electric current $I_{Sense}$ according to one exemplary embodiment of the invention. In this case, a current measuring device 11 is initially provided in step 110. The current measuring device 11 provides an output signal $U_S$ at said current measuring device 11 in step 120, said output signal corresponding to the electric current $I_{Sense}$ through said current measuring device 11. There is thereby preferably a linear relationship between the output signal $U_S$ of the current measuring device 11 and the current $I_{Sense}$ through the current measuring device. In step 130, the electric current $I_{Sense}$ through the current measuring device 11 is furthermore limited to a predetermined maximum limit value.

In order to limit the maximum electric current through the current measuring device 11, a predetermined reference voltage $U_{Ref}$ can be provided, which is compared to the output signal $U_S$ provided in step 120. In this case, the step 130 for limiting the electric current adjusts this electric current $I_{Sense}$ in accordance with the comparison of the emitted output signal $U_S$ to the reference voltage $U_{Ref}$ provided.

Although the present invention was described above in a preferred manner with reference to a bipolar transistor comprising an insulated gate (IGBT), wherein the IGBT has an additional sense connection, the present invention can likewise be applied to any other circuit arrangements in which a current in a power path is determined on the basis of a measuring current corresponding to said current in the power path. The limitation of the current in the measuring path is also not limited to a comparison of a reference voltage to an output voltage corresponding to the measuring current. Other options for limiting the current in the measuring path are likewise possible. Alternatively to emitting a voltage signal corresponding to the measuring current $I_{Sense}$, any other output signal can be provided by means of which the measuring current $I_{Sense}$ and thus the current in the power path can be determined.

In summary, the present invention relates to an evaluation of the variable of an electric current in a power path by evaluating another electric current in a measuring path. To avoid excessively large currents in the measuring path, the current in said path is limited to a predetermined maximum limit value.

The invention claimed is:

1. A current detection device (10) for sensing an electric current ($I_{sense}$) in a measuring path, which conducts an electric current that corresponds to an electric current ($I_E$) in a power path, the current detection device comprising:
   a current measuring device (11), which is disposed in the measuring path and is designed to provide an output signal that corresponds to an electric current flowing through said current measuring device (11); and
   a current limiting device (12) configured to limit the electric current through the current measuring device (11) to a predetermined maximum limit value,
   wherein, when the electric current ($I_E$) in the power path exceeds a predefined value, the electric current ($I_{Sense}$) in the measuring path is limited to the predetermined maximum limit value.

2. The current detection device (10) according to claim 1, wherein the current measuring device (11) is configured to provide a voltage signal which is proportional to the electric current that flows through said current measuring device (11), and when the electric current ($I_{Sense}$) in the measuring path is limited to the predetermined maximum limit value, the electric current ($I_E$) through the power path is not limited.

3. A current detection device (10) for sensing an electric current ($I_{sense}$) in a measuring path, which conducts an electric current that corresponds to an electric current ($I_E$) in a power path, the current detection device comprising:
   a current measuring device (11) disposed in the measuring path and configured to provide an output signal that corresponds to an electric current flowing through said current measuring device (11), the current measuring device including an analog/digital converter configured to convert the output signal dependent on the electric current flowing through the current measuring device (11) into a digital signal; and a current limiting device (12), which is configured to limit the electric current through the current measuring device (11) to a predetermined maximum limit value.

4. The current detection device (10) according to claim 1, wherein the current limiting device (12) comprises a reference voltage source ($U_{Ref}$) which is designed to provide a predetermined reference voltage; and the current limiting device (12) is designed to compare a further voltage signal to the reference voltage provided by the reference voltage source ($U_{Ref}$) and to adjust the electric current through the current measuring device (11) on the basis of the comparison.

5. The current detection device (10) according to claim 4, wherein the current limiting device (12) comprises a transistor (T5) having a control connection and said current limiting device (12) is designed to provide, at the control connection of the transistor (T5), a control signal based on the comparison between provided reference voltage and the further voltage signal.

6. A circuit arrangement (1) for providing an electric current ($I_E$), the circuit arrangement comprising:

a current control device (20) which is designed to provide an electric current ($I_E$) in a power path and to provide an electric measuring current ($I_{Sense}$) in a measuring path which corresponds to the electric current ($I_E$) provided in the power path; and the current detection device (10) according to claim 1.

7. The circuit arrangement (1) according to claim 6, wherein the current control device (20) comprises one bipolar transistor having an insulated gate, the one bipolar transistor providing the electric measuring current ($I_{Sense}$) to the measuring path and the electric current ($I_E$) to the power path.

8. A method for sensing an electric current ($I_{Sense}$) in a measuring path, which conducts an electric current that corresponds to an electric current ($I_E$) in a power path, comprising the following steps:

providing a current measuring device (11) for the electric current ($I_{Sense}$) in the measuring path;

sensing the electric current ($I_{Sense}$) through the current measuring device (11)-provided in the measuring path;

emitting an output signal from the current measuring device (11) as a function of the sensed electric current ($I_{Sense}$) in the measuring path;

limiting the electric current ($I_{Sense}$) through the current measuring device (11) in the measuring path to a predetermined maximum limit value; and not limiting the electric current ($I_E$) through the power path when the electric current ($I_{Sense}$) in the measuring path is limited to the predetermined maximum limit value.

9. The method according to claim 8, further comprising the steps:

providing a predetermined reference voltage; and comparing the emitted output signal to the predetermined reference voltage;

wherein the step for limiting the electric current adjusts the current in accordance with the comparison of the predetermined reference voltage to a voltage value.

10. The method according to claim 8, including providing a current control device (20) including one bipolar transistor that outputs both the electric current ($I_{Sense}$) in the measuring path and the electric current ($I_E$) in the power path, wherein the one bipolar transistor includes an insulated gate.

11. The method according to claim 10, wherein the current measuring device (11) is a resistor, and the limiting of the electric current through the current measuring device (11) is provided by a transistor (T5) having a control connection.

12. The method according to claim 10, wherein the current measuring device includes an analog/digital converter configured to convert the output signal of the current measuring device (11) into a digital signal.

13. The circuit arrangement according to claim 7, the circuit arrangement further comprising a compensation circuit (30) that receives the electric current ($I_E$) from the power path.

14. The circuit arrangement according to claim 13, the compensation circuit (30) including two voltage sources, a current source ($I_O$), and transistors (T1-T4).

* * * * *